United States Patent [19]

Kieselstein

[11] Patent Number: 4,757,522
[45] Date of Patent: Jul. 12, 1988

[54] COUNTING CIRCUIT EMPLOYING MORE EQUATABLY USED PLURAL COUNTERS FOR EXTENDED LIFE

[75] Inventor: Dirk Kieselstein, Mörfelden-Walldorf, Fed. Rep. of Germany

[73] Assignee: VDO Adolf Schindling AG, Frankfurt am Main, Fed. Rep. of Germany

[21] Appl. No.: 913,959

[22] Filed: Oct. 1, 1986

[51] Int. Cl.⁴ ............... H03K 21/40; G11C 21/00
[52] U.S. Cl. ............................. 377/26; 377/24.1; 377/28; 377/33
[58] Field of Search ............ 377/28, 24.1, 15, 32, 377/33, 26

[56] References Cited

U.S. PATENT DOCUMENTS 4,512,029 4/1985 Brice ........................... 377/32
4,663,770 5/1987 Murray et al. ................ 377/44

Primary Examiner—John S. Heyman
Attorney, Agent, or Firm—Martin A. Farber

[57] ABSTRACT

In a counting circuit having non-volatile electrically erasable memory elements and a plurality of similar counters each representing one place of the count, respective memory elements of suitable capacity are associated with the counters. Low value counters can be connected cyclically to each other via their counting inputs and transfer outputs. Their association with the other places of a count is changed as a function of the count of the highest-value place. In this way, the result is obtained, without additional expense for memory, that the individual memory elements are erased equally frequently during the life of the counting circuit.

10 Claims, 1 Drawing Sheet

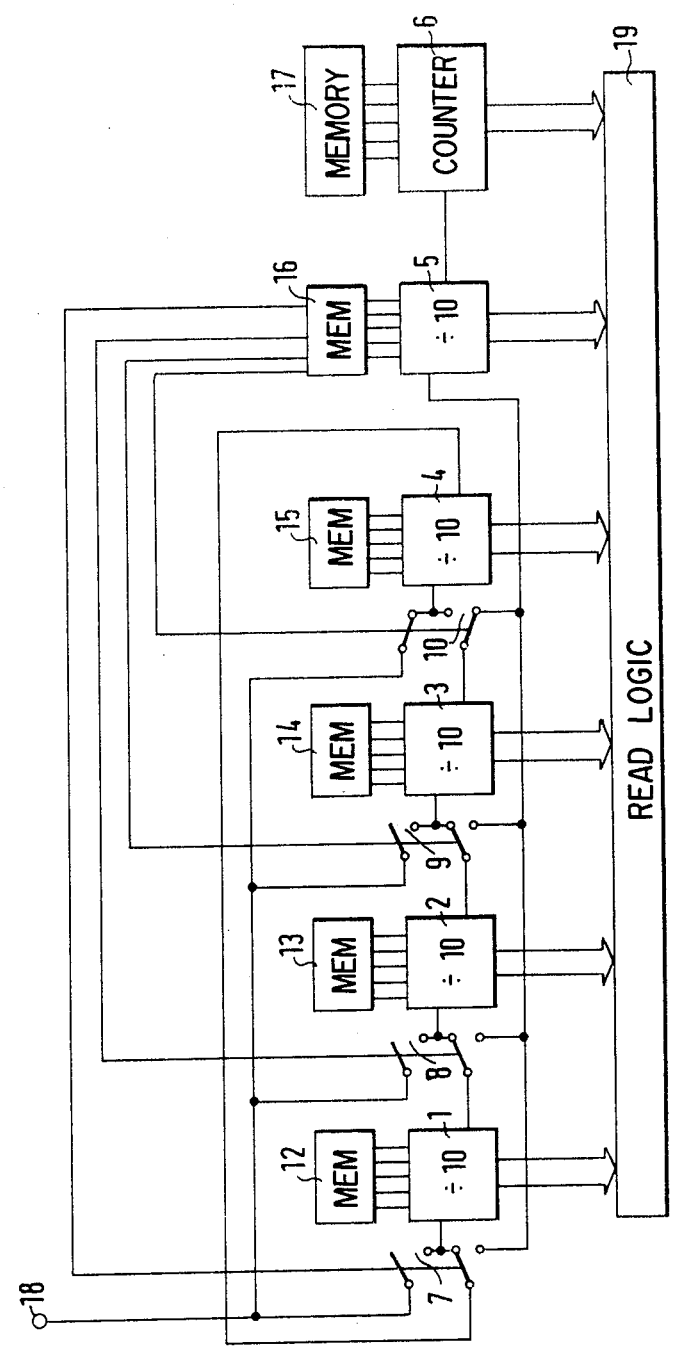

COUNTING CIRCUIT EMPLOYING MORE EQUATABLY USED PLURAL COUNTERS FOR EXTENDED LIFE

The present invention relates to a counting circuit with non-volatile electrically erasable memory elements in which circuit a plurality of similar counters, each representing one place of a counting value, are provided.

As odometers for automotive vehicles there are known electronic counting circuits in which the storing of the corresponding count is effected by means of non-volatile electrically erasable memories, particularly floating-gate memory elements. In this way, a storage time of several years with the operating voltage disconnected is possible.

These memories, however, have the disadvantage that the erasure time increases with an increasing number of erasings. In known counting circuits, therefore, the number of erase cycles is kept small by storing the count in a single-step code in the non-volatile memory.

In the customary organization of a multi-decade counter and memory, a lower decade changes the value of its places more frequently upon incrementing than do the places of the next-higher decade. It is therefore known in counting circuits with non-volatile electrically erasable memory elements to provide means controlled at different counts for the cyclic exchange of the addresses of the memory locations of the lowest decades. For the carrying out of this cyclic exchange a considerable expense is required. Furthermore, additional memory locations are required for the storing of the corresponding association.

The object of the present invention is to provide a counting circuit with non-volatile electrically erasable memory elements in which the number of erasings is distributed as uniformly as possible over the memories and in which the circuitry expense is kept as small as possible.

This object is achieved in accordance with the invention by associating a non-volatile electrically erasable memory of suitable capacity with each of the counters, and by providing that the counters for the low-value places can be connected cyclically to each other via their counting inputs and transfer outputs and that, as a function of the count of the place of higher value, an associating of the counters with the other places of the count is changed. The counting circuit of the invention is advantageous in that a fixed association is present between the counters and their respective memories, and that the storing of the instantaneous association of the counters with the individual places of the count does not require any additional expense since the association is established by a higher-value place of the count which is in any event placed in memory.

In accordance with a further aspect of the invention, between counters which can be cyclically connected to each other, switch means in each case either connect two successive counters with each other or connect transfer output of the one counter to the counting input of a counter for the higher-value place and the counting input of a following counter to the input of the counting circuit. Control inputs of the switch means are connected with outputs of the counter for the higher-value place. These switch means may consist, for instance, of gate circuits.

Although a preferred field of use of the counting circuit of the invention is as odometer in an automobile, the invention can also be used in connected with other counters in which the count is to be retained even when the operating voltage is disconnected or insufficient.

Another advantage of the counting circuit of the invention results from the fact that the counters are connected to the non-volatile electrically erasable memories over sets of parallel data lines. In this way, rapid transfer of the count from the counters into the memories is possible so that in case of failure of the operating voltage, brief buffering by a capacitor is sufficient in order to protect the count.

Finally, a further development of the invention resides in the fact that, in each case, at least one counter and a corresponding non-volatile electrically erasable memory can be constructed on a common substrate.

One embodiment will be described in further detail below with reference to the sole FIGURE which is a block diagram shown in the drawing.

The embodiment shown in the drawing is designed for an odometer of an automobile, and comprises six decade counters 1 to 6. Only the counters 6 and 5 of 100,000 kilometers and 10,000 kilometers, respectively, are permanently associated with each other. The other counters 1 to 4 are not firmly associated with any of the ones, tens hundreds or thousands places of a count.

With each counter 1 to 6 there is associated a non-volatile electrically erasable memory 12, 13, 14, 15, 16, 17 which is able to store the count of the corresponding counter even without the supply of operating voltage. The counters 1 to 6 are connected directly to the corresponding associated memories 12 to 17 via sets of parallel data lines.

The counters 1 to 4 are connected to each other by switch means 7, 8, 9, 10 which, for the sake of simplicity, have been shown in the FIGURE in each case as being formed of two mechanical switches. In order to produce the counting circuit of the invention, however, ordinary gate circuits are used in accordance with digital technique.

The pulses to be counted are fed via an input 18 to one of the counters 1 to 4. For this purpose, the switch means 10 for instance, is, in the lower position. The other switch means 7, 8, 9 are, as shown, in the upper position and connect the counters in cyclic sequence to each other in such a manner that in each case one transfer output of one counter is connected with the counting input of a following counter.

The switch means 7 to 10 are controlled via control signals from the memory 16 of the ten-thousands counter 5. Thus, by way of a further example, during the first 10,000 km, counter 1 may be supplied via the switch means 7 with counting pulses and is therefore intended as counter for the ones position. During the second ten thousand km the counter 2 is then connected to the input 18 via the switch means 8, etc. In this way, during the entire planned useful life of the counting circuit a uniform stressing of the memories associated with the counters is obtained. An additional storing of the corresponding association of counters or memories with the corresponding decimal places is not necessary since the association is dependent directly on the count of the highest-value decimal place, which is stored in any event.

In the FIGURE there is also indicated the connection of the counters 1 to 6 to a read logic 19 which permits a display of the position of the counter. Other circuit details of the function blocks indicated have not been shown since they are well-known to a man skilled in the art and need not be explained for an understanding of the invention.

I claim:

1. A counting circuit with non-volatile electrically erasable memory elements, said circuit comprising
a plurality of similar counters, each of said counters having an input and a transfer output, each counter representing one place of a count;
a plurality of non-volatile electrically erasable memory elements connected to respective ones of the counters; and
connection means for switchably interconnecting said counters serially by the respective inputs and transfer outputs to form a series of the counters, counters near one end of the series being lower-value place counters, counters near a second end of the series being higher-value place counters, a switching of interconnections interchanging locations of counters in said series; and wherein
counters for lower-value places of the count are cyclically connected to each other via their counter inputs and transfer outputs, association of the counters with respective places of the count being changed by said connection means as a function of a signal of the counter of a higher-value place of the count, said connection means including a memory addressable by a higher-value place counter for designating an arrangement of switching connections of the counters as a function of a higher-value place of a count of the counting circuit, a cyclical rearrangement of the counters allowing for more uniform usage of the counters and their respective memory elements.

2. The counting circuit according to claim 1, wherein said connection means is operative for either connecting two consecutive counters with each other or connecting a transfer output of a counter to the counting input of a counter for a higher-value place, said connection means connecting the counting input of a counter following a series of counters with an input of the counting circuit; and wherein
said connection means includes a plurality of switches having control inputs connected via said memory to outputs of the counter for the higher-value place of the count.

3. The counting circuit according to claim 1, wherein the counters are decade counters.

4. The counting circuit according to claim 3, wherein the counters are one-step, five-bit counting code counters.

5. The counting circuit according to claim 1, wherein the non-volatile electrically erasable memory elements are formed of floating-gate memory cells.

6. The counting circuit according to claim 3, wherein the counting circuit is part of an odometer in an automobile.

7. The counting circuit according to claim 6, wherein six decade counters are provided.

8. The counting circuit according to claim 6, further comprising
a buffer capacitor having a capacitance sufficient to transfer the data present in the counters into the non-volatile electrically erasable memory elements in the event of a failure of a supply voltage.

9. The counting circuit according to claim 1, wherein the counters are connected to the non-volatile electrically erasable memory elements via sets of parallel data lines.

10. The counting circuit according to claim 9, wherein
a counter and the associated non-volatile electrically erasable memory element are disposed on a common substrate.

* * * * *